(12) United States Patent
Kuroda et al.

(10) Patent No.: US 10,314,166 B2
(45) Date of Patent: Jun. 4, 2019

(54) PRINTED WIRING BOARD

(71) Applicant: IBIDEN CO., LTD., Ogaki-shi (JP)

(72) Inventors: Nobuhisa Kuroda, Ogaki (JP); Hirofumi Futamura, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 245 days.

(21) Appl. No.: 14/996,298

(22) Filed: Jan. 15, 2016

(65) Prior Publication Data
US 2016/0212854 A1    Jul. 21, 2016

(30) Foreign Application Priority Data

Jan. 16, 2015    (JP) .................... 2015-006363

(51) Int. Cl.
| H05K 1/02 | (2006.01) |
| H01L 23/498 | (2006.01) |
| H01L 21/48 | (2006.01) |
| H01L 23/538 | (2006.01) |

(52) U.S. Cl.
CPC ......... H05K 1/0271 (2013.01); H01L 21/486 (2013.01); H01L 21/4857 (2013.01); H01L 23/49822 (2013.01); H01L 23/49827 (2013.01); H01L 23/49838 (2013.01); H01L 23/49833 (2013.01); H01L 23/5389 (2013.01); H01L 2224/16227 (2013.01); H01L 2224/81192 (2013.01); H01L 2924/15331 (2013.01); H01L 2924/18161 (2013.01); H01L 2924/3511 (2013.01); H05K 2201/09227 (2013.01); H05K 2201/10674 (2013.01)

(58) Field of Classification Search
None
See application file for complete search history.

(56) References Cited

U.S. PATENT DOCUMENTS

| 2007/0086147 A1* | 4/2007 | Kawamura .......... B23K 3/0623 361/600 |
| 2009/0056987 A1* | 3/2009 | Nomiya .............. H01L 21/4857 174/255 |
| 2009/0169837 A1* | 7/2009 | An .................... H01L 23/49822 428/201 |

(Continued)

FOREIGN PATENT DOCUMENTS

JP    2002-261402 A    9/2002

*Primary Examiner* — Courtney L Smith
*Assistant Examiner* — Jessey R Ervin
(74) *Attorney, Agent, or Firm* — Oblon, McClelland, Maier & Neustadt, L.L.P.

(57) ABSTRACT

A printed wiring board for mounting a semiconductor element includes an insulating substrate, a first conductor structure on first side of the substrate, and a second conductor structure on second side of the substrate. The substrate has a first area and a second area outside the first area such that when a semiconductor element is mounted on the first side, the first area is directly below the element, the first structure has a first area conductor structure in the first area and a second area conductor structure in the second area, and the first structure is formed such that first ratio is set greater than second ratio, where the first ratio is obtained by dividing volume of the first area structure by area of the first area structure, and the second ratio is obtained by dividing volume of the second area structure by area of the second area structure.

20 Claims, 6 Drawing Sheets

(56) References Cited

U.S. PATENT DOCUMENTS

| | | | |
|---|---|---|---|
| 2012/0227261 A1* | 9/2012 | Inui | H05K 1/186 |
| | | | 29/849 |
| 2013/0240258 A1* | 9/2013 | Ishida | H05K 1/0306 |
| | | | 174/258 |
| 2014/0353026 A1* | 12/2014 | Hattori | H01L 24/81 |
| | | | 174/262 |
| 2015/0223330 A1* | 8/2015 | Oi | H05K 1/113 |
| | | | 361/767 |

* cited by examiner

PRINTED WIRING BOARD

CROSS-REFERENCE TO RELATED APPLICATIONS

The present application is based upon and claims the benefit of priority to Japanese Patent Application No. 2015-006363, filed Jan. 16, 2015, the entire contents of which are incorporated herein by reference.

BACKGROUND OF THE INVENTION

Field of the Invention

The present invention relates to a printed wiring board for mounting a semiconductor element.

Description of Background Art

Japanese Patent Laid-Open Publication No. 2002-261402 describes a circuit substrate in which warpage that occurs due to heat during reflow is prevented by adjusting a thickness and the like of each conductor layer. The entire contents of this publication are incorporated herein by reference.

SUMMARY OF THE INVENTION

According to one aspect of the present invention, a printed wiring board for mounting a semiconductor element includes an insulating substrate, a first conductor structure formed on a first side of the insulating substrate, and a second conductor structure formed on a second side of the insulating substrate on the opposite side with respect to the first side. The insulating substrate has a first area and a second area outside the first area such that when a semiconductor element is mounted on the first side of the insulating substrate, the first area is directly below the semiconductor element, the first conductor structure has a first area conductor structure formed in the first area and a second area conductor structure formed in the second area, and the first conductor structure is formed such that a first ratio is set greater than a second ratio, where the first ratio is obtained by dividing a volume of the first area conductor structure by an area of the first area conductor structure, and the second ratio is obtained by dividing a volume of the second area conductor structure by an area of the second area conductor structure.

According to another aspect of the present invention, a semiconductor device includes a printed wiring board, and a semiconductor element mounted on the printed wiring board. The printed wiring board has an insulating substrate, a first conductor structure formed on a first side of the insulating substrate, and a second conductor structure formed on a second side of the insulating substrate on the opposite side with respect to the first side, the insulating substrate has a first area and a second area outside the first area such that the semiconductor element is mounted on the first side of the insulating substrate and that the first area is directly below the semiconductor element, the first conductor structure has a first area conductor structure formed in the first area and a second area conductor structure formed in the second area, and the first conductor structure is formed such that a first ratio is set greater than a second ratio, where the first ratio is obtained by dividing a volume of the first area conductor structure by an area of the first area conductor structure, and the second ratio is obtained by dividing a volume of the second area conductor structure by an area of the second area conductor structure.

According to yet another aspect of the present invention, a method for manufacturing a printed wiring board includes preparing an insulating substrate having a first area and a second area outside the first area such that when a semiconductor element is mounted on a first side of the insulating substrate, the first area is directly below the semiconductor element, forming a first conductor structure on the first side of an insulating substrate such that the first conductor structure has a first area conductor structure formed in the first area and a second area conductor structure formed in the second area, and that a first ratio is set greater than a second ratio, where the first ratio is obtained by dividing a volume of the first area conductor structure by an area of the first area conductor structure, and the second ratio is obtained by dividing a volume of the second area conductor structure by an area of the second area conductor structure, and forming a second conductor structure on a second side of the insulating substrate on the opposite side with respect to the first side.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

The embodiments will now be described with reference to the accompanying drawings, wherein like reference numerals designate corresponding or identical elements throughout the various drawings.

Printed Wiring Board Of Embodiment And First Applied Example

Figure 2A:
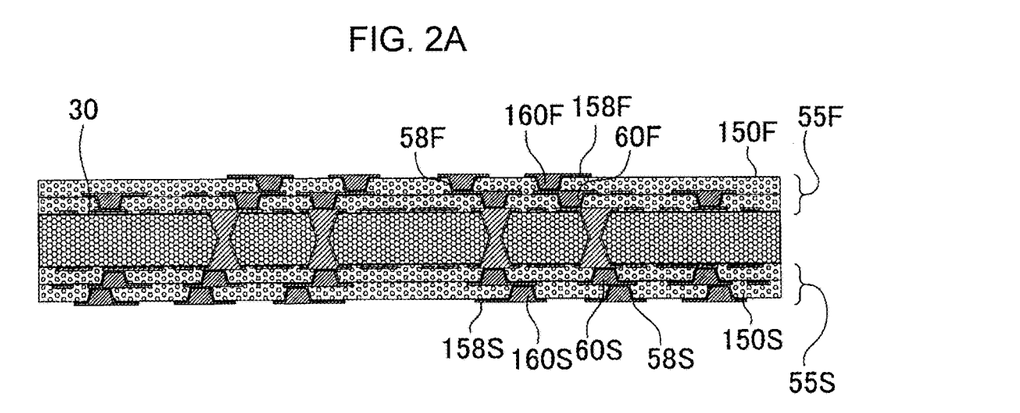
FIG. 2A-2C are process diagrams illustrating the method for manufacturing the printed wiring board of the embodiment.
Figure 2B:
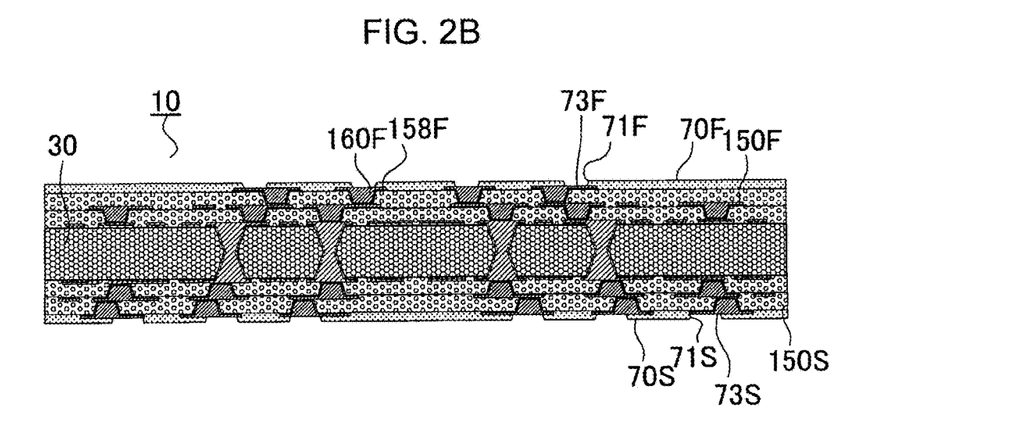
Figure 3A:
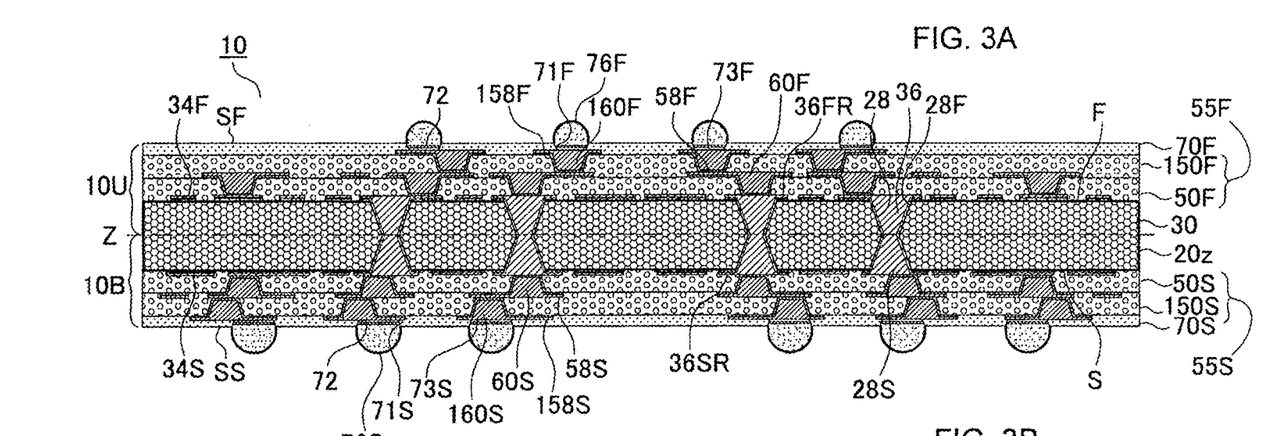
FIG. 3A is a cross-sectional view of the printed wiring board of the embodiment.

A printed wiring board 10 according to an embodiment of the present invention is illustrated in FIGS. 3A and 2B. The printed wiring board 10 of the embodiment has a core substrate 30. The core substrate 30 includes: an insulating substrate (20z) that has a first surface (F) and a second surface (S) that is on an opposite side of the first surface (F);

a first conductor layer (34F) that is formed on the first surface (F) of the insulating substrate; a second conductor layer (34S) that is formed on the second surface of the insulating substrate; and a through-hole conductor 36 that connects the first conductor layer (34F) and the second conductor layer (34S) and penetrates the insulating substrate. The first conductor layer (34F) includes a land (36FR) of the through-hole conductor, and the second conductor layer (34S) includes a land (36SR) of the through-hole conductor. The first conductor layer and the second conductor layer each also include a solid pattern and conductor circuits. A land of the through-hole conductor is formed by a conductor such as a plating film that is formed on the through-hole conductor and around the through-hole conductor. The land on the through-hole conductor is a conductor projecting from the insulating substrate. A first surface of the core substrate and the first surface of the insulating substrate are the same surface; and a second surface of the core substrate and the second surface of the insulating substrate are the same surface.

An interlayer resin insulating layer (upper side interlayer resin insulating layer) (50F) is formed on the first surface (F) of the core substrate 30. A conductor layer (upper side conductor layer) (58F) is formed on the interlayer resin insulating layer (50F). The conductor layer (58F), the first conductor layer (34F) and the through-hole conductor 36 are connected by a via conductor (upper side via conductor) (60F) that penetrates the interlayer resin insulating layer (50F). An interlayer resin insulating layer (uppermost interlayer resin insulating layer) (150F) is formed on the interlayer resin insulating layer (50F) and the conductor layer (58F). A conductor layer (uppermost conductor layer) (158F) is formed on the interlayer resin insulating layer (150F). The uppermost conductor layer (158F) and the upper side conductor layer (58F) are connected by a via conductor (uppermost via conductor) (160F) that penetrates the interlayer resin insulating layer (150F). An upper side build-up layer (55F) is formed by the interlayer resin insulating layer (50F), the conductor layer (58F), the via conductor (60F), the interlayer resin insulating layer (150F), the conductor layer (158F) and the via conductor (160F). In the present embodiment, the upper side build-up layer is formed by two layers.

An interlayer resin insulating layer (lower side interlayer resin insulating layer) (50S) is formed on the second surface (S) of the core substrate 30. A conductor layer (lower side conductor layer) (58S) is formed on the interlayer resin insulating layer (50S). The conductor layer (58S), the second conductor layer (34S) and the through-hole conductor 36 are connected by a via conductor (lower side via conductor) (60S) that penetrates the interlayer resin insulating layer (50S). An interlayer resin insulating layer (lowermost interlayer resin insulating layer) (150S) is formed on the lower side interlayer resin insulating layer (50S) and the lower side conductor layer (58S). A conductor layer (lowermost conductor layer) (158S) is formed on the interlayer resin insulating layer (150S). The lowermost conductor layer (158S) and the lower side conductor layer (58S) are connected by a via conductor (lowermost via conductor) (160S) that penetrates the interlayer resin insulating layer (150S). A lower side build-up layer (55S) is formed by the interlayer resin insulating layer (50S), the conductor layer (58S), the via conductor (60S), the interlayer resin insulating layer (150S), the conductor layer (158S) and the via conductor (160S). In the present embodiment, the lower side build-up layer is formed by two layers.

An upper side solder resist layer (70F) is formed on the upper side build-up layer (55F). As illustrated in FIG. 3A, an upper surface of the upper side solder resist layer is an uppermost surface (SF) of the printed wiring board 10. A lower side solder resist layer (70S) is formed on the lower side build-up layer (55S). As illustrated in FIG. 3A, an upper surface of the lower side solder resist layer is a lowermost surface (SS) of the printed wiring board 10. The solder resist layer (70F) has an opening (71F) that exposes an upper surface of the conductor layer (158F) or the via conductor (160F). The solder resist layer (70S) has an opening (71S) that exposes an upper surface of the conductor layer (158S) or the via conductor (160S). A solder bump (C4 bump) (76F) is formed on an upper side pad (73F) that is exposed from the opening (71F) of the upper side solder resist layer (70F). A solder bump (BGA bump) (76S) is formed on a lower side pad (73S) that is exposed from the opening (71S) of the lower side solder resist layer (70S).

Among the insulating substrate (20z), the interlayer resin insulating layers (50F, 50S, 150F, 150S) and the solder resist layers (70F, 70S), the insulating substrate (20z) is the thickest.

As illustrated in FIG. 3A, the printed wiring board 10 is divided by a plane (Z). The plane (Z) is positioned in the middle between the first surface (F) and the second surface (S). A distance between the plane (Z) and the first surface (F) and a distance between the plane (Z) and the second surface (S) are the same. A printed wiring board between the plane (Z) and the uppermost surface (SF) is an upper side printed wiring board (10U), and a printed wiring board between the plane (Z) and the lowermost surface (SS) is a lower side printed wiring board (10B).

Figure 3B:
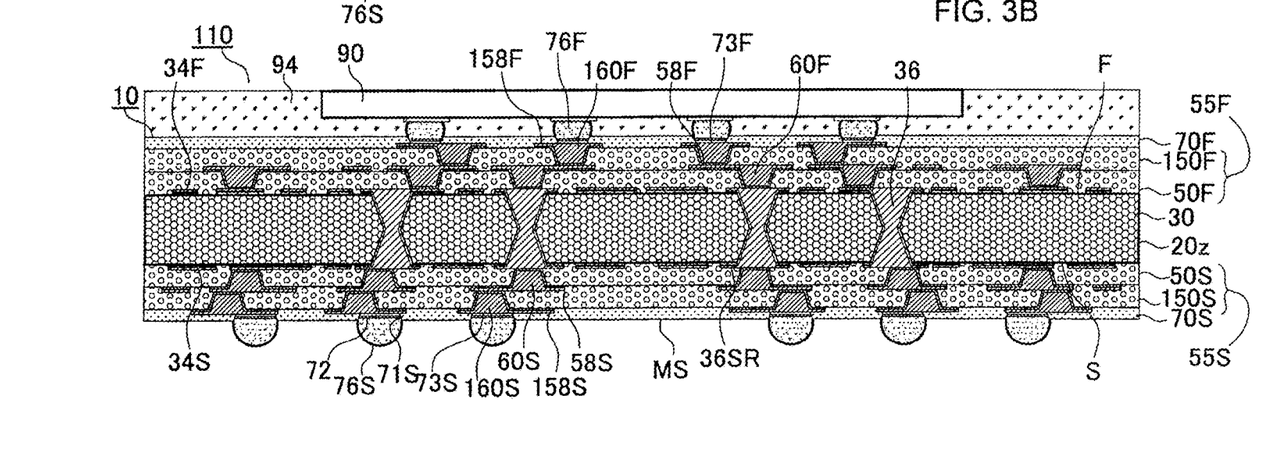
FIG. 3B is a cross-sectional view of a first applied example.

FIG. 3B illustrates a cross-sectional view of a first applied example 110 of the printed wiring board 10. The first applied example 110 includes the printed wiring board 10 and a semiconductor element 90 that is mounted on the printed wiring board 10. The first applied example may further include a mold resin 94 illustrated in FIG. 3B. The semiconductor element 90 is mounted on the upper side build-up layer via the solder bump (76F). FIG. 5C illustrates a plan view of the first applied example 110. FIG. 5C is obtained by observing the first applied example 110 of FIG. 3B from a position above the semiconductor element 90. FIG. 5C illustrates an upper surface of the semiconductor element 90 and an upper surface of the printed wiring board 10 that is exposed from the semiconductor element 90. A dotted line illustrates an outer periphery of the semiconductor element 90, and a solid line illustrates an outer periphery of the printed wiring board 10. An area positioned directly below the semiconductor element is a first area (E1). An area inside the dotted line is the first area (E1). A printed wiring board positioned inside the dotted line is referred to as a printed wiring board in the first area. An area outside the first area is a second area (E2). In FIG. 5C, an area between the dotted line and the solid line is the second area (E2). A printed wiring board positioned between the dotted line and the solid line is referred to as a printed wiring board in the second area.

A plane obtained by connecting centers or centroids of upper side pads (73F) is referred to as a mounting surface. When flatness of the mounting surface is high, connection reliability between an electronic component 90 such as a semiconductor element and the printed wiring board 10 is high. A mounting yield is high.

As illustrated in FIG. 3B, the printed wiring board 10 of the present embodiment is a printed wiring board for mounting an electronic component such as a semiconductor element. Physical properties of the semiconductor element 90 and physical properties of the printed wiring board 10 are different. Examples of the physical properties include a thermal expansion coefficient and a Young's modulus. When the semiconductor element 90 is mounted on the printed wiring board 10, the printed wiring board 10 and the semiconductor element 90 are heated. In order for the semiconductor element 90 and the printed wiring board 10 to be firmly bonded to each other, it is desirable that flatness of the printed wiring board in the first area be high. When the flatness is high, variation in bonding strength between pads of printed wiring board and electrodes of the electronic component is reduced. As a result, connection reliability between the electronic component and the printed wiring board is improved. Among materials that form the printed wiring board 10, the conductor layers are formed of a metal. The metal has high rigidity. Further, the metal has a high melting point and thus, when an electronic component is mounted on the printed wiring board, the rigidity of the metal is maintained. Therefore, when a semiconductor element is mounted on the printed wiring board, the conductor layers can strengthen the first area. Therefore, it is preferable that a volume of a conductor in the first area be large. It is preferable that a ratio (ratio 1) of the volume of the conductor in the first area be high. The ratio of the volume of the conductor in the first area is obtained by dividing the volume of the conductor of the conductor layers that are formed in the first area by an area of the first area. The first conductor layer (34F) and the conductor layers (58F, 158F) that belong to the upper side build-up layer (55F) are close to the mounting surface. Therefore, the conductor layers (34F, 58F, 158F) that are formed on the first surface of the insulating substrate have a large influence on the flatness of the printed wiring board in the first area. It is preferable that a volume of the conductor of the first conductor layer (34F) that is formed in the first area and a ratio of the volume of the conductor of the first conductor layer (34F) that is formed in the first area be large. It is preferable that a volume of the conductor of the conductor layers (58F, 158F) that are formed in the first area and a ratio of the volume of the conductor of the conductor layers (58F, 158F) that are formed in the first area be large. In particular, the first conductor layer (34F) is formed on the insulating substrate and thus affects the flatness of the printed wiring board in the first area. The conductor layers (58F, 158F) are conductor layers that belong to the upper side build-up layer.

The first applied example 110 has the semiconductor element on the first area. Therefore, the printed wiring board in the first area is greatly affected by the semiconductor element. In contrast, the printed wiring board in the second area is not significantly affected by the semiconductor element. A thermal expansion coefficient of a metal such as copper that forms a conductor layer is greater than a thermal expansion coefficient of the semiconductor element 90. Further, the thermal expansion coefficient of the metal that forms the conductor layer is greater than a thermal expansion coefficient of the insulating substrate. Here, the thermal expansion coefficient of the insulating substrate is a value in a direction parallel to the first surface (F). When temperature of the first applied example 110 rises, extension of the printed wiring board of the first area is inhibited by the semiconductor element. In contrast, extension of the printed wiring board in the second area is large due to a conductor layer formed in the second area. Therefore, in the first applied example 110, a difference between a deformation amount of the printed wiring board in the first area and a deformation amount of the printed wiring board in the second area is likely to become large. The first applied example 110 is susceptible to distortion during heat cycles. In order to prevent these, in the printed wiring board 10 of the present embodiment, the volume of the conductor of each of the conductor layers (34F, 58F, 158F) on the first surface (F) that are formed on the second area is small. In each of the conductor layers (34F, 58F, 158F) that are formed on the first surface (F) of the insulating substrate, the volume of the conductor in the second area is smaller than the volume of the conductor in the first area. The ratio of the volume of the conductor of each of the conductor layers (34F, 58F, 158F) on the first surface (F) that are formed in the second area is low. In each of the conductor layers (34F, 58F, 158F) that are formed on the first surface (F) of the insulating substrate, the ratio of the volume of the conductor in the second area is smaller than the ratio of the volume of the conductor in the first area. The ratio (ratio 2) of the volume of the conductor in the second area is obtained by dividing the volume of the conductor of the conductor layers that are formed in the second area by an area of the second area. In each of the conductor layers (34F, 58F, 158F) that are formed on the first surface (F) of the insulating substrate, a value obtained by dividing the ratio 1 by the ratio 2 is 1.2 or more and 5 or less. Distortion is effectively suppressed. According to the printed wiring board of the present embodiment, a printed wiring board on which an electronic component can be easily mounted can be provided. Warpage, distortion and swelling of the first applied example 110 are reduced. Therefore, the first applied example is stable for a long period of time even when being subjected to heat cycles.

Modified Example 1 of Printed Wiring Board of First Embodiment and Second Applied Example In the printed wiring board 10 of the first embodiment, a volume of a conductor and a ratio of the volume of the conductor of the second conductor layer 34S and the conductor layers (58S, 158S) (the conductor layers (58S, 158S) belonging to the lower side build-up layer) are arbitrary. In contrast, in a modified example 1, these are controlled. The volume of the conductor and the ratio of the volume of the conductor of the second conductor layer 34S and the conductor layers (58S, 158S) (the conductor layers (58S, 158S) belonging to the lower side build-up layer) are described below. In the modified example 1, a volume of a conductor of the conductor layers (conductor layers on the second surface (S) of the insulating substrate) (34S, 58S, 158S) that are formed in the second area is larger than a volume of a conductor of the conductor layers (conductor layers on the second surface (S) of the insulating substrate) (34S, 58S, 158S) that are formed in the first area. A ratio of the volume of the conductor of the conductor layers (conductor layers on the second surface (S) of the insulating substrate) (34S, 58S, 158S) that are formed in the second area is greater than a ratio of the volume of the conductor of the conductor layers (conductor layers on the second surface (S) of the insulating substrate) (34S, 58S, 158S) that are formed in the first area. A value obtained by dividing the ratio of the volume of the conductor of the conductor layers (conductor layers on the second surface (S) of the insulating substrate) (34S, 58S, 158S) that are formed in the second area by the ratio of the volume of the conductor of the conductor layers (conductor layers on the second surface (S) of the insulating substrate) (34S, 58S, 158S) that are formed in the first area is 1.2 or more 5 or less. An electronic component 90 such as a semiconductor element is mounted on a printed wiring board of the modified example 1. A second applied example is completed. When the temperature of the first applied example rises, the printed wiring board of the first embodiment tends to extend. However, in the printed wiring board of the first embodiment, the extension of the core substrate 30 on the first surface (F) side in the first area is suppressed by the semiconductor element 90. On the other hand, when the temperature of the first applied example drops, the printed wiring board tends to contract. However, in the printed wiring board of the first embodiment, the contraction of the core substrate 30 on the first surface (F) side in the first area is suppressed by the semiconductor element 90. In this way, a stress occurs in the core substrate 30 on the first surface (F) side in the first area due to heat cycles. There is a risk that the core substrate of the first applied example deteriorates due to heat cycles. However, in the modified example 1, a volume of a conductor of the conductor layers belonging to the lower side build-up layer (55S) in the first area is smaller than a volume of a conductor of the conductor layers belonging to the lower side build-up layer (55S) in the second area. A ratio of the volume of the conductor of the conductor layers belonging to the lower side build-up layer (55S) in the first area is smaller than a ratio of the volume of the conductor of the conductor layers belonging to the lower side build-up layer (55S) in the second area. A volume of a conductor of the second conductor layer (34S) in the first area is smaller than a volume of a conductor of the second conductor layer (34S) in the second area. A ratio of the volume of the conductor of the second conductor layer (34S) in the first area is smaller than a ratio of the volume of the conductor of the second conductor layer (34S) in the second area. Therefore, in the second applied example, a thermal expansion coefficient of the core substrate 30 on the second surface (S) side in the first area is smaller than a thermal expansion coefficient of the core substrate 30 on the first surface (F) side in the first area. Therefore, even when the second applied example is subjected to heat cycles, extension and contraction of the core substrate of the second applied example on the second surface (S) side are small. Further, a distance between the second surface (S) and the semiconductor element 90 is greater than a distance between the first surface (F) and the semiconductor element 90. The semiconductor element 90 does not have a large influence on the core substrate on the second surface (S) side. Therefore, in the second applied example, stress acting on the core substrate on the second surface (S) side is small. According to the second applied example, stress acting on the core substrate in the first area is reduced. Even when the second applied example is subjected to heat cycles, the core substrate of the second applied example is unlikely to deteriorate. Even when the second applied example is used for a long period of time, malfunction is unlikely to occur.

Modified Example 2 of Printed Wiring Board of First Embodiment and Third Applied Example In the printed wiring board 10 of the first embodiment, the volume of the conductor and the ratio of the volume of the conductor of the second conductor layer 34S and the conductor layers (58S, 158S) (the conductor layers (58S, 158S) belonging to the lower side build-up layer) are arbitrary. In contrast, in a modified example 2, these are controlled. The volume of the conductor and the ratio of the volume of the conductor of the second conductor layer 34S and the conductor layers (58S, 158S) (the conductor layers (58S, 158S) belonging to the lower side build-up layer) are described below. In the modified example 2, a volume of a conductor of the conductor layers (conductor layers on the second surface (S) of the insulating substrate) (34S, 58S, 158S) that are formed in the second area is smaller than a volume of a conductor of the conductor layers (conductor layers on the second surface (S) of the insulating substrate) (34S, 58S, 158S) that are formed in the first area. A ratio of the volume of the conductor of the conductor layers (conductor layers on the second surface (S) of the insulating substrate) (34S, 58S, 158S) that are formed in the second area is smaller than a ratio of the volume of the conductor of the conductor layers (conductor layers on the second surface (S) of the insulating substrate) (34S, 58S, 158S) that are formed in the first area. A value obtained by dividing the ratio of the volume of the conductor of the conductor layers (conductor layers on the second surface (S) of the insulating substrate) (34S, 58S, 158S) that are formed in the first area by the ratio of the volume of the conductor of the conductor layers (conductor layers on the second surface (S) of the insulating substrate) (34S, 58S, 158S) that are formed in the second area is 1.2 or more 5 or less. An electronic component 90 such as a semiconductor element is mounted on a printed wiring board of the modified example 2. A third applied example is completed.

The third applied example has a surface (connection surface) (MS) for connecting to a motherboard. The connection surface (MS) is a surface that includes centers of centroids of all lower side pads (73S). The lower side pads (73S) are formed over a substantially entire surface of the printed wiring board. When flatness of the connection surface (MS) is high, connection reliability between the third applied example and the motherboard is high.

The third applied example is mounted on the motherboard by reflow. In this case, the third applied example is heated. An area (first area) directly below the IC chip is reinforced by the semiconductor element. Therefore, the flatness of the connection surface in the first area is high. However, the connection surface in the second area is not reinforced by the semiconductor element and thus the flatness of the connection surface is likely to be reduced. In order to reduce such a disadvantage, in the modified example 2, a volume of a conductor of the conductor layers (58S, 158S) belonging to the lower side build-up layer (55S) in the first area is larger than a volume of a conductor of the conductor layers (58S, 158S) belonging to the lower side build-up layer (55S) in the second area. A ratio of the volume of the conductor of the conductor layers (58S, 158S) belonging to the lower side build-up layer (55S) in the first area is greater than a ratio of the volume of the conductor of the conductor layers (58S, 158S) belonging to the lower side build-up layer (55S) in the second area. A volume of a conductor of the second conductor layer (34S) in the first area is larger than a volume of a conductor of the second conductor layer (34S) in the second area. A ratio of the volume of the conductor of the second conductor layer (34S) in the first area is greater than a ratio of the volume of the conductor of the second conductor layer (34S) in the second area. Therefore, a weight of the lower side build-up layer (55S) in the second area and the core substrate 30 on the second surface (S) side in the second area is reduced. The third applied example is unlikely to warp due to gravity.

A volume of a conductor of the conductor layers (58F, 158F) belonging to the upper side build-up layer (55F) in the second area is smaller than a volume of a conductor of the conductor layers (58F, 158F) belonging to the upper side build-up layer (55F) in the first area. A ratio of the volume of the conductor of the conductor layers (58F, 158F) belonging to the upper side build-up layer (55F) in the second area is smaller than a ratio of the volume of the conductor of the conductor layers (58F, 158F) belonging to the upper side build-up layer (55F) in the first area. A volume of a conductor of the first conductor layer (34F) in the second area is smaller than a volume of a conductor of the first conductor layer (34F) in the first area. A ratio of the volume of the conductor of the first conductor layer (34F) in the second area is smaller than a ratio of the volume of the conductor of the first conductor layer (34F) in the first area. The third applied example is unlikely to warp due to gravity.

Therefore, a motherboard and the third applied example are reliably connected. Connection reliability between the motherboard and the third applied example is high.

Reference Example of Applied Examples

Figure 5A:
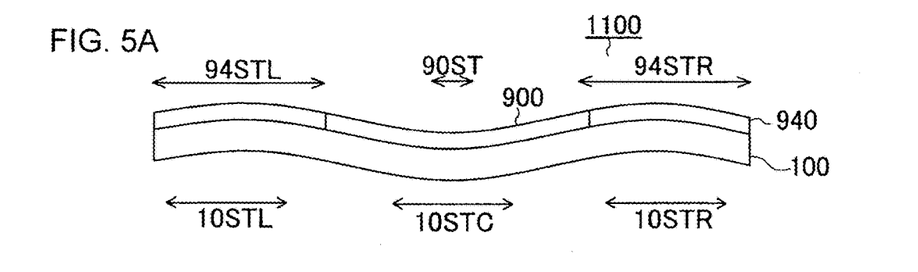
FIG. 5A is a schematic diagram of a reference example of the applied example.
Figure 6A:
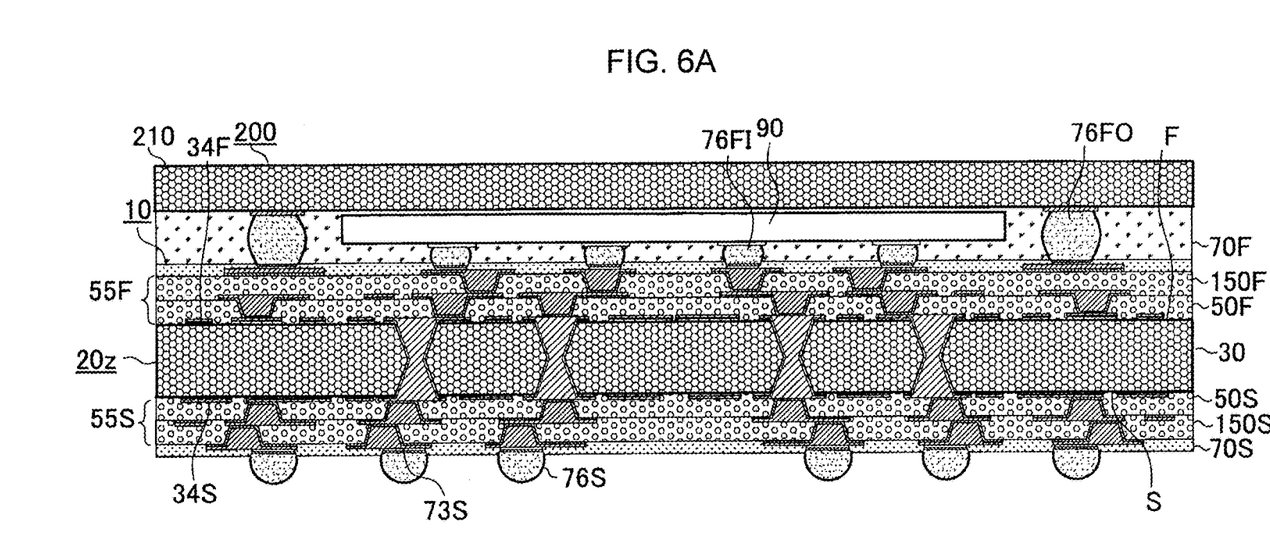
FIG. 6A is a cross-sectional view of a fifth applied example.
Figure 6B:
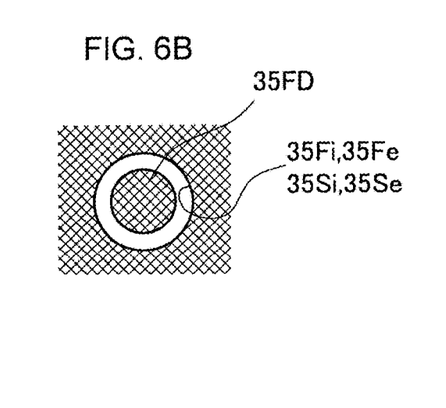
FIG. 6B is a plan view illustrating a portion of a conductor layer.
Figure 6C:
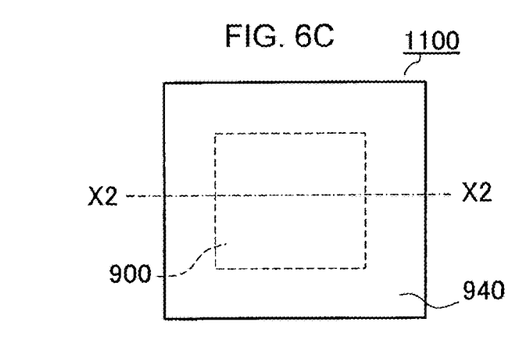
FIG. 6C is a plan view of a reference example of the applied example.

A cross-sectional view and a plan view of a reference example 1100 of the applied examples are respectively illustrated in FIGS. 5A and 6C. A cross section of the reference example 1100 along a line X2-X2 in FIG. 6C is illustrated in FIG. 5A. A schematic diagram of the reference example 1100 of the applied examples is illustrated in FIG. 5A. FIG. 5A illustrates a cross-sectional view of the reference example 1100. FIG. 6C illustrates a semiconductor element 900 and a mold resin 940 that is exposed from the semiconductor element 900. As illustrated in FIG. 6C, the semiconductor element 900 is mounted substantially at a center of a printed wiring board 100. The reference example 1100 illustrated in FIG. 5A includes the printed wiring board 100, the semiconductor element 900 and the mold resin 940. Similar to FIG. 3B, the semiconductor element 900 is mounted on the printed wiring board 100 via a solder bump on an upper side pad. Similar to FIG. 3B, the semiconductor element 900 is sealed by the mold resin 940. Similar to FIG. 3B, the mold resin 940 is formed between the printed wiring board 100 and the semiconductor element 900 and on an upper side solder resist layer (70F). The mold resin 940 is formed on the printed wiring board in the first area and on the printed wiring board in the second area. In the printed wiring board 100, a volume of a conductor of conductor layers in the first area and a volume of a conductor of conductor layers in the second area are the same. Or, in the printed wiring board 100, a ratio of the volume of the conductor of the conductor layers in the first area and a ratio of the volume of the conductor of the conductor layers in the second area are the same.

The schematic diagram of FIG. 5A illustrates a shape of the reference example 1100 at a high temperature. The high temperature is 180 degrees or more and 300 degrees or less. Further, in FIG. 5A, an extension amount of each part of the reference example at the high temperature is indicated using a size of an arrow. The extension amount is relatively indicated by the size of the arrow. An arrow (94STL) and an arrow (94STR) indicate extension amounts of the mold resin 940. An arrow (90ST) indicates an extension amount of the semiconductor element 900. An arrow (10STL), an arrow (10STC) and an arrow (10STR) indicate extension amounts of the printed wiring board 100. In the reference example 1100, a thermal expansion coefficient of the mold resin 940 is greater than a thermal expansion coefficient of the printed wiring board 100 and a thermal expansion coefficient of the semiconductor element 900. The thermal expansion coefficient of the printed wiring board 100 is greater than the thermal expansion coefficient of the semiconductor element 900.

When the reference example 1100 is heated in order to mount the reference example 1100 on the motherboard, due to the differences between the thermal expansion coefficients, extension amounts of the parts of the reference example 1100 are different. The extension amounts of the parts are indicated by the sizes of the arrows in FIG. 5A.

In the reference example 1100, the extension amount (90ST) of the semiconductor element 900 is smaller than the extension amount (10STC) of the printed wiring board in the first area. Therefore, the reference example 1100 in the first area has a concave warpage as illustrated in FIG. 5A. In the second area, the extension amounts (94STL, 94STR) of the mold resin are greater than the extension amounts (10STL, 10STR) of the printed wiring board. Therefore, the reference example 1100 in the second area has a convex warpage as illustrated in FIG. 5A. When the temperature of the reference example 1100 rises, the reference example 1100 has a large swelling as illustrated in FIG. 5A. When the temperature of the reference example 1100 drops, the reference example 1100 has a large swelling opposite to the swelling illustrated in FIG. 5A. Due to heat cycles, the reference example 1100 repeats swellings of different shapes. Due to heat cycles, reliability of the reference example 1100 decreases. A length of an arrow indicates an extension amount. Extension amounts are relatively compared using the lengths of the arrows.

The applied example (110, 1100) is arranged on a flat surface 500 such that the printed wiring board (10, 100) faces the flat surface 500. When an outer periphery of the applied example (110, 1100) floats from the flat surface, the applied example (110, 1100) has a concave warpage (FIG. 4C). When a central portion of the applied example (110, 1100) floats from the flat surface, the applied example (110, 1100) has a convex warpage (FIG. 4D).

Fourth Applied Example

Figure 5B:
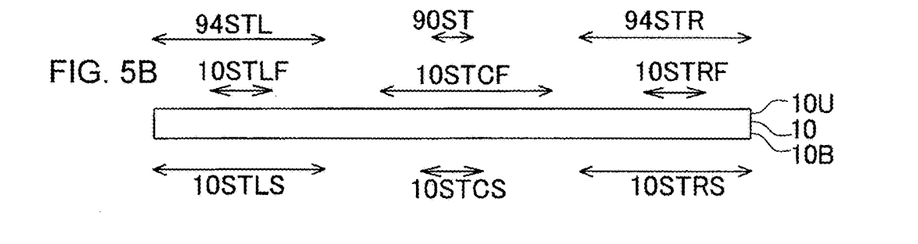
FIG. 5B is a schematic diagram of a modified example 1.
Figure 5C:
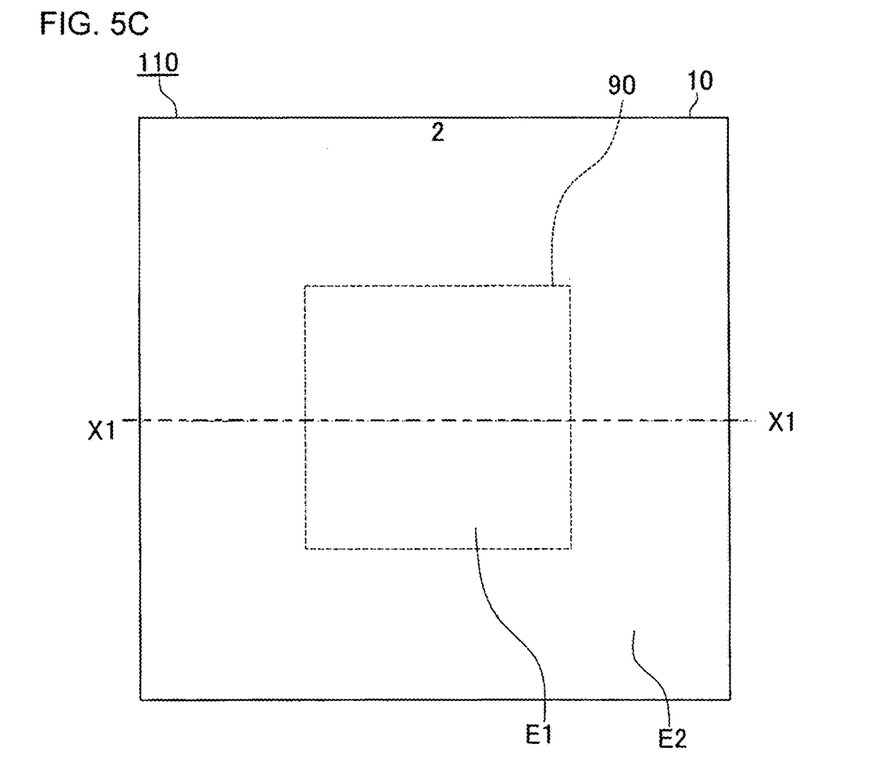
FIG. 5C is a plan view of the first applied example.

An example for reducing the disadvantage of the reference example 1100 is a fourth applied example. The printed wiring board 10 of the modified example 1 is used as a printed wiring board of the fourth applied example. FIG. 5B illustrates a schematic diagram of the printed wiring board of the modified example 1 and arrows that each indicate an extension amount. A size of an arrow in FIG. 5B indicates a relative extension amount at a high temperature.

Arrows (10STLF, 10STCF, 10STRF) indicate extension amounts of an upper side printed wiring board (10U) on the printed wiring board 10 of FIG. 5B. The extension amounts are relatively depicted by sizes of the arrows (10STLF, 10STCF, 10STRF). The arrows (10STLF, 10STRF) indicate extension amounts of the upper side printed wiring board (10U) in the second area. The arrow (10STCF) indicates an extension amount of the upper side printed wiring board (10U) in the first area.

Arrows (10STLS, 10STCS, 10STRS) indicate extension amounts of a lower side printed wiring board (10B) below the printed wiring board 10 of FIG. 5B. The extension amounts are relatively depicted by the lengths of the arrows (10STLS, 10STCS, 10STRS). The arrows (10STLS, 10STRS) indicate extension amounts of the lower side printed wiring board (10B) in the second area. The arrow (10STCS) indicates an extension amount of the lower side printed wiring board (10B) in the first area.

The arrows (94STL, 94STR) that indicates the extension amounts of the mold resin and the arrow (90ST) that indicates the extension amount of the semiconductor element are illustrated above the arrows (10STLF, 10STCF, 10STRF) that indicate the extension amounts of the upper side printed wiring board (10U). The extension amounts are relatively depicted by the lengths of the arrows (94STL, 94STR, 90ST). The arrows (94STL, 94STR) indicate the extension amounts of the mold resin in the second area. The semiconductor element is formed in the first area.

In the second area, the arrow (10STLF) is sandwiched by the arrow (94STL) and arrow (10STLS). The arrow (10STRF) is sandwiched by the arrow (94STR) and the arrow (10STRS). According to the arrows (94STL, 94STR)

and the arrows (10STLF, 10STRF), the upper side extends and the lower side contracts and thus a convex warpage is obtained. According to the arrows (10STLS, 10STRS) and the arrows (10STLF, 10STRF), the upper side contracts and the lower side extends and thus a concave warpage is obtained. In this way, in the second area, the small extension is sandwiched by the large extensions. Therefore, the shape of the warpage of the applied example positioned on the upper side and the shape of the warpage of the applied example positioned on the lower side are opposite to each other. The warpages are counterbalanced. Therefore, the warpage of the fourth applied example in the second area is reduced.

In the first area, the arrow (10STCF) is sandwiched by the arrow (90ST) and the arrow (10STCS). According to the arrow (90ST) and the arrow (10STCF), the upper side contracts and the lower side extends and thus a concave warpage is obtained. According to the arrow (10STCF) and the arrow (10STCS), the upper side extends and the lower side contracts and thus a convex warpage is obtained. In this way, in the first area, the large extension is sandwiched by the small extensions. Therefore, the shape of the warpage of the applied example positioned on the upper side and the shape of the warpage of the applied example positioned on the lower side are opposite to each other. The warpages are counterbalanced. Therefore, the warpage of the fourth applied example in the first area is reduced.

When the temperature drops, the fourth applied example tends to have warpages opposite to the warpages at the high temperature. However, similar to FIG. 5B, the warpages are counterbalanced.

In this way, according to the fourth applied example, warpage, swelling and distortion due to heat cycles are reduced. Reliability is increased. The connection reliability between the fourth applied example and the motherboard is improved. Yield for mounting the fourth applied example on the motherboard is increased.

Figure 4A:
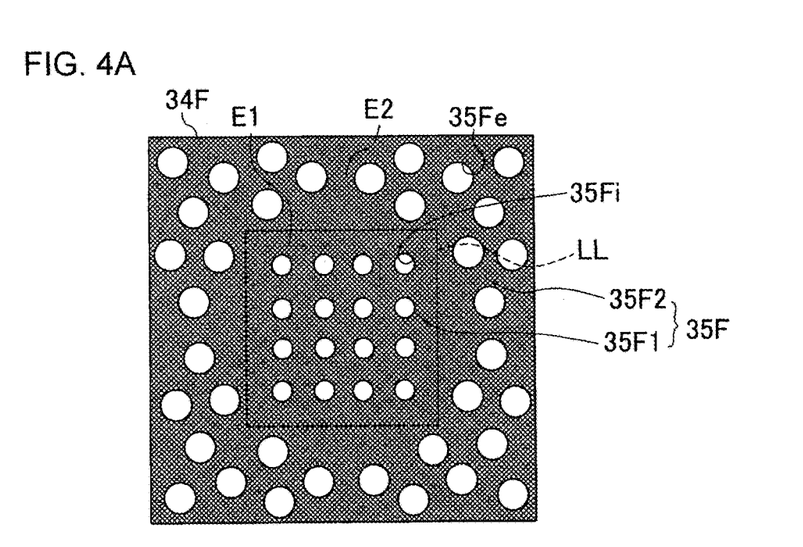
FIGS. 4A and 4B are plan views of conductor layers of the printed wiring board according to the embodiment.
Figure 4B:
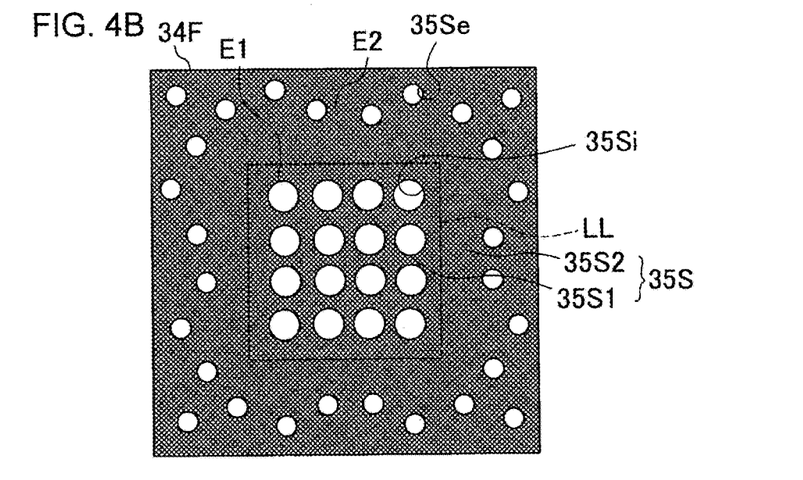
Figure 4C:
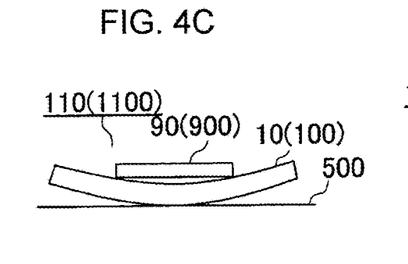
FIG. 4C illustrates a concave warpage.
Figure 4D:
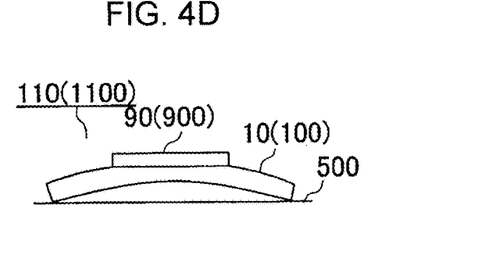
FIG. 4D illustrates a convex warpage.

Example for Adjusting Volume of Conductor and Ratio of Volume of Conductor in Conductor Layer FIGS. 4A and 4B illustrate examples of conductor layers. These are plan views of conductor layers. A dotted line (LL) is depicted in a conductor layer. The printed wiring board 10 can be divided into a first area (E1) and a second area (E2). The dotted line (LL) is depicted on a boundary between the first area (E1) and the second area (E2). A region surrounded by the dotted line (LL) is the first area (E1). A region on the outside of the dotted line (LL) is the second area (E2). The electronic component 90 is mounted on the first area (E1). When the electronic component is projected onto the conductor layer with parallel light at the same magnification, an outer circumference of the electronic component coincides with the dotted line (LL).

FIG. 4A is an example of the first conductor layer (34F).

The first conductor layer (34F) of FIG. 4A has a solid pattern (35F) for a power source. The solid pattern (35F) is formed by a solid pattern (35F1) in the first area and a solid pattern (35F2) in the second area. Most of the first surface (F) is covered by the solid pattern (35F). The solid pattern has openings (35Fi, 35Fe) that expose a first surface. The openings (35Fi) are formed in the solid pattern (35F1) that is formed in the first area (E1), and the openings (35Fe) are formed in the solid pattern (35F2) that is formed in the second area (E2). A volume of a conductor and a ratio of the volume of the conductor in the first area (E1) are adjusted by adjusting size, number and density of the openings (35Fi). A volume of a conductor and a ratio of the volume of the conductor in the second area (E2) are adjusted by adjusting size, number and density of the openings (35Fe). In FIG. 4A, the volume of the conductor in the first area (E1) is greater than the volume of the conductor in the second area (E2). In FIG. 4A, the ratio of the volume of the conductor in the first area (E1) is greater than the ratio of the volume of the conductor in the second area (E2).

Similar to the first conductor layer, a conductor layer belonging to an upper side build-up layer is formed by a conductor layer formed in the first area (E1) and a conductor layer formed in the second area (E2). A volume of a conductor and a ratio of the volume of the conductor of each conductor layer belonging to the upper side build-up layer formed in the first area (E1) are adjusted by adjusting size, number and density of the openings. A volume of a conductor and a ratio of the volume of the conductor in the second area (E2) are adjusted by adjusting size, number and density of the openings. The volume of the conductor of each conductor layer belonging to the upper side build-up layer formed in the first area is greater than the volume of the conductor of each conductor layer belonging to the upper side build-up layer formed in the second area. The ratio of the volume of the conductor of each conductor layer belonging to the upper side build-up layer formed in the first area is greater than the ratio of the volume of the conductor of each conductor layer belonging to the upper side build-up layer formed in the second area.

FIG. 4B is an example of the second conductor layer (34S).

The second conductor layer (34S) of FIG. 4B has a solid pattern (35S) for grounding. Most of the second surface (S) is covered by the solid pattern (35S). The solid pattern (35S) is formed by a solid pattern (35S1) in the first area and a solid pattern (35S2) in the second area. The solid pattern (35S) has openings (35Si, 35Se) that expose a second surface. The openings (35Si) are formed in the solid pattern (35S1) that is formed in the first area (E1), and the openings (35Se) are formed in the solid pattern (35S2) that is formed in the second area (E2). A volume of a conductor and a ratio of the volume of the conductor in the first area (E1) are adjusted by adjusting size, number and density of the openings (35Si). A volume of a conductor and a ratio of the volume of the conductor in the second area (E2) are adjusted by adjusting size, number and density of the openings (35Se). In FIG. 4B, the volume of the conductor in the first area (E1) is smaller than the volume of the conductor in the second area (E2). In FIG. 4B, the ratio of the volume of the conductor in the first area (E1) is smaller than the ratio of the volume of the conductor in the second area (E2).

Similar to the second conductor layer, a conductor layer belonging to a lower side build-up layer is formed by a conductor layer formed in the first area (E1) and a conductor layer formed in the second area (E2). A volume of a conductor and a ratio of the volume of the conductor of each conductor layer belonging to the lower side build-up layer formed in the first area (E1) are adjusted by adjusting size, number and density of the openings. A volume of a conductor and a ratio of the volume of the conductor of each conductor layer belonging to the lower side build-up layer formed in the second area (E2) are adjusted by adjusting size, number and density of the openings. The volume of the conductor of each conductor layer belonging to the lower side build-up layer formed in the first area is smaller than the volume of the conductor of each conductor layer belonging to the lower side build-up layer formed in the second area. The ratio of the volume of the conductor of each conductor layer belonging to the lower side build-up layer formed in the first area is smaller than the ratio of the volume of the conductor of each conductor layer belonging to the lower side build-up layer formed in the second area. The second conductor layer and the conductor layers belonging to the lower side build-up layer can be formed by conductor layers similar to that of FIG. 4A.

Method for Manufacturing Printed Wiring Board of Embodiment

A method for manufacturing the printed wiring board 10 is illustrated in FIG. 1A-1E and FIG. 2A-2C.

Figure 1A:
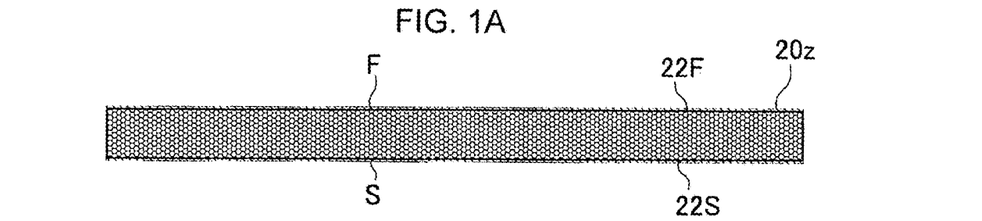
FIG. 1A-1E are process diagrams illustrating a method for manufacturing a printed wiring board according to an embodiment of the present invention.

The insulating substrate (core material) (20*z*) having the first surface (F) and the second surface (S) is prepared. The insulating substrate (20*z*) includes a reinforcing material and a resin. A starting substrate is formed by the insulating substrate (20*z*) and copper foils (22F, 22S) that are respectively laminated on both sides of the insulating substrate (20*z*) (FIG. 1A). Examples of the reinforcing member include a glass cloth, a glass fiber and an aramid fiber. The resin is an epoxy resin, a BT (bismaleimide triazine) resin, or the like.

Figure 1B:
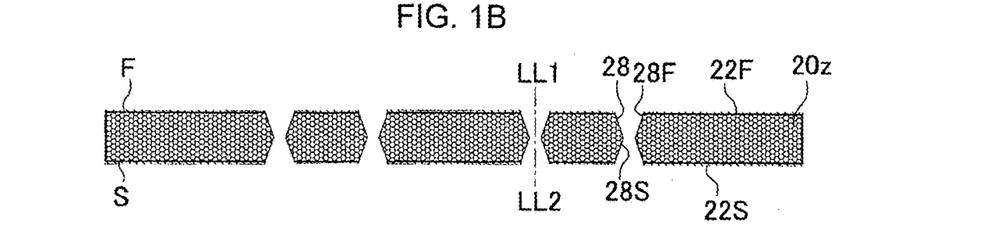

CO2 laser is irradiated to the copper foil (22F) on the first surface (F). A first opening part (28F) for forming a through hole for a through-hole conductor is formed in the insulating substrate (20*z*) on the first surface (F) side of the insulating substrate (20*z*). Further, CO2 laser is irradiated to the copper foil (22S) on the second surface (S). A second opening part (28S) connecting to the first opening part (28F) is formed. As illustrated in FIG. 1B, laser is irradiated such that an axis (LL1) of the first opening part and an axis (LL2) of the second opening part coincide. A through hole 28 for the through-hole conductor is formed (FIG. 1B). The first opening part (28F) tapers from the first surface (F) toward the second surface (S). The second opening part (28S) tapers from the second surface (S) toward the first surface (F).

Figure 1C:
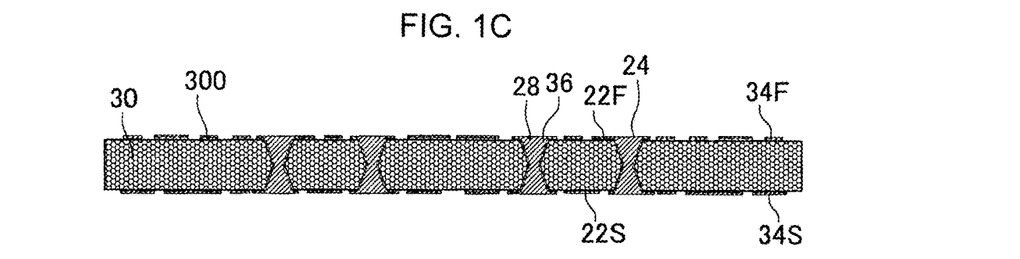

An electroless plating film is formed on the copper foils (22F, 22S) and a side wall of the through hole 28. Thereafter, an electrolytic plating film is formed on the electroless plating film. A plating film 24, which is formed from the electroless plating film and the electrolytic plating film on the electroless plating film, is formed in the through hole. At the same time, the plating film 24 is formed on the first surface and the second surface of the insulating substrate. The through hole 28 is filled by the electrolytic plating film. An etching resist is formed on the plating film 24. A volume of a conductor and a ratio of the volume of the conductor in the first area (E1) are adjusted by adjusting a pattern of the etching resist. A volume of a conductor and a ratio of the volume of the conductor in the second area (E2) are adjusted by adjusting a pattern of the etching resist. The plating film 24 and the copper foils (22F, 22S) that are exposed from the etching resist are removed. The etching resist is removed. The first conductor layer (34F), which includes the first conductor layer in the first area (E1) and the first conductor layer in the second area (E2), is formed on the first surface of the insulating substrate. The second conductor layer (34S), which includes the second conductor layer in the first area (E1) and the second conductor layer in the second area (E2), is formed on the second surface of the insulating substrate. The through-hole conductor 36 that connects the first conductor layer and the second conductor layer is formed in the through hole 28. A core substrate 30 is obtained that includes the insulating substrate that has the through hole 28, the through-hole conductor 36 that is formed in the through hole 28, the first conductor layer (34F) that is formed on the first surface of the insulating substrate, and the second conductor layer (34S) that is formed on the second surface insulating substrate (FIG. 1C). The first conductor layer (34F) has the solid pattern (35F) illustrated in FIG. 4A, and the second conductor layer (34S) has the solid pattern (35S) illustrated in FIG. 4B.

Figure 1D:
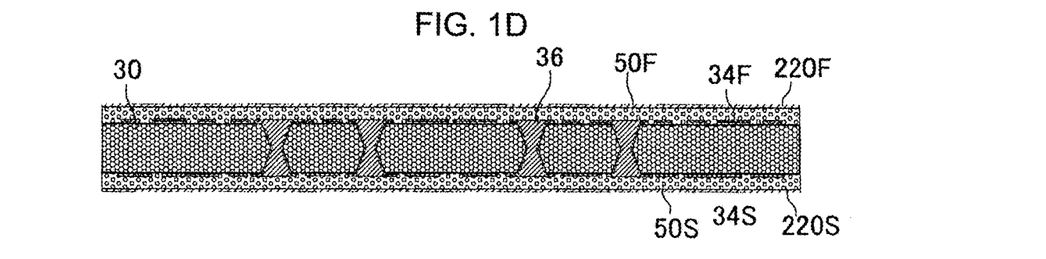

A prepreg that contains a glass cloth, inorganic particles such as silica, a thermosetting resin such as epoxy is laminated on the first surface (F) and on the second surface (S) of the core substrate 30. Copper foils (220F, 220S) are laminated on the prepreg. Thereafter, by hot pressing, the upper side interlayer resin insulating layer (50F) and the lower side interlayer resin insulating layer (50S) are formed from the prepregs (FIG. 1D). An interlayer resin insulating layer containing only inorganic particles and a resin may also be used.

Next, using CO2 gas laser, an opening (51F) for a via conductor is formed in the upper side interlayer resin insulating layer (50F), and an opening (51S) for a via conductor is formed in the lower side interlayer resin insulating layer (50S). The opening (51F) reaches the first conductor layer (34F), and the opening (51S) reaches the second conductor layer (34S). An electroless copper plating film 52 is formed on the interlayer resin insulating layers (50F, 50S) and on inner walls of the openings (51F, 51S). A plating resist is formed on the electroless copper plating layer 52. A volume of a conductor and a ratio of the volume of the conductor in the first area (E1) are adjusted by adjusting a pattern of the plating resist. A volume of a conductor and a ratio of the volume of the conductor in the second area (E2) are adjusted by adjusting a pattern of the plating resist. An electrolytic copper plating layer 56 is formed on the electroless copper plating layer 52 that is exposed from the plating resist. The plating resist is removed. The electroless copper plating layer 52 and the copper foils (220F, 220S) that are exposed from the electrolytic copper plating layer 56 are removed by etching. The upper side conductor layer (58F), which includes an upper side conductor layer in the first area (E1) and an upper side conductor layer in the second area (E2), is formed on the upper side interlayer resin insulating layer (50F). The lower side conductor layer (58S), which includes a lower side conductor layer in the first area (E1) and a lower side conductor layer in the second area (E2), is formed on the lower side interlayer resin insulating layer (50S). At the same time, the upper side via conductor (60F) that penetrates the upper side interlayer resin insulating layer and reaches the first conductor layer (34F) is formed, and the lower side via conductor (60S) that penetrates the lower side interlayer resin insulating layer and reaches the second conductor layer (34S) is formed (FIG. 1E).

Figure 1E:
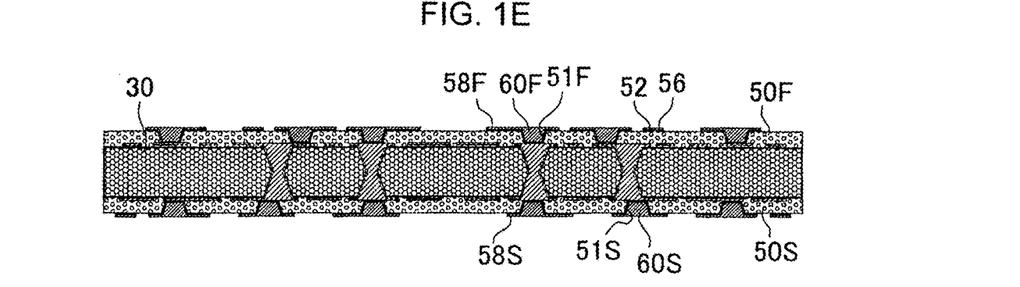

The processes illustrated in FIGS. 1D and 1E are repeated. The uppermost interlayer resin insulating layer (150F) is formed on the upper side interlayer resin insulating layer (50F) and the upper side conductor layer (58F). The uppermost conductor layer (158F), which includes an uppermost conductor layer in the first area (E1) and an uppermost conductor layer in the second area (E2), is formed on the uppermost interlayer resin insulating layer (150F). The uppermost via conductor (160F) that connects the upper side conductor layer (58F) and the uppermost conductor layer (158F) is formed in the uppermost interlayer resin insulating layer (150F).

The lowermost interlayer resin insulating layer (150S) is formed on the lower side interlayer resin insulating layer (50S) and the lower side conductor layer (58S). The lowermost conductor layer (158S), which includes a lowermost conductor layer in the first area (E1) and a lowermost conductor layer in the second area (E2), is formed on the lowermost interlayer resin insulating layer (150S). The lowermost via conductor (160S) that connects the lower side conductor layer (58S) and the lowermost conductor layer (158S) is formed in the lowermost interlayer resin insulating layer (150S).

The upper side build-up layer (55F) and the lower side build-up layer (55S) are completed (FIG. 2A).

The upper side solder resist layer (70F) having the opening (71F) is formed on the upper side build-up layer. The lower side solder resist layer (70S) having the opening (71S) is formed on the lower side build-up layer (FIG. 2B). A conductor layer exposed from the opening (71F) of the upper side solder resist layer (70F) and an upper surface of a via conductor function as C4 pads (upper side pads) (73F). On the other hand, a conductor layer and an upper surface of a via conductor that are exposed from the opening (71S) of the lower side solder resist layer (70S) function as BGA pads (lower side pads) (73S). The printed wiring board 10 is completed.

Figure 2C:
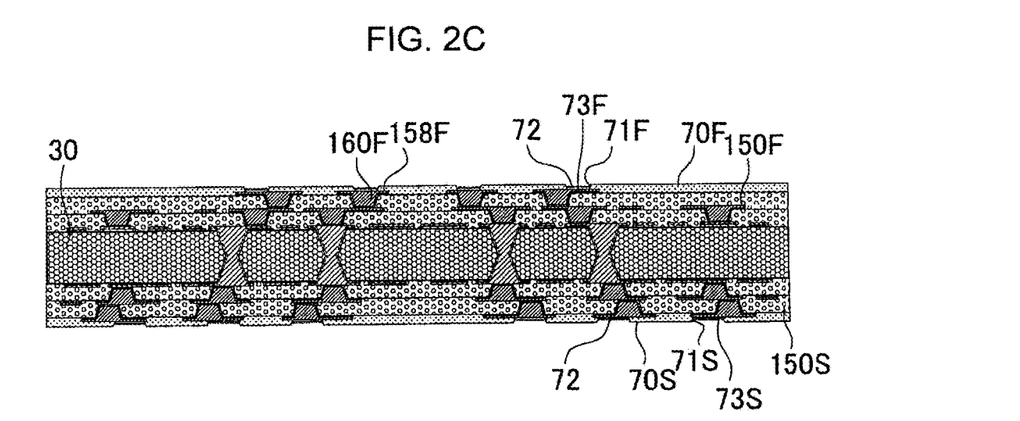

A protective film 72 can be formed on the C4 pads (73F) and the BGA pads (73S) (FIG. 2C). The protective film is a film for preventing oxidation of the pads. The protective film is formed, for example, by a Ni/Au, Ni/Pd/Au, Pd/Au or OSP (Organic Solderability Preservative) film.

The solder bumps (76F, 76S) are formed on the C4 pads (73F) and the BGA pads (73S). The printed wiring board 10 having the solder bumps is completed (FIG. 3A).

The IC chip 90 is mounted on the printed wiring board 10 via the C4 bump (76F). The mold resin 94 is formed between the IC chip and the printed wiring board and on the printed wiring board. The first applied example 110 of the printed wiring board is completed (FIG. 3B).

Another Example for Adjusting Volume of Conductor and Ratio of Volume of Conductor in Conductor Layer A width and a length of a conductor circuit contained in a conductor layer in the first area (E1) and a width and a length of a conductor circuit contained in a conductor layer in the second area (E2) are respectively different. As a result, a volume of a conductor in the first area (E1) and a volume of a conductor in the second area (E2) are different. A ratio of the volume of the conductor in the first area (E1) and a ratio of the volume of the conductor in the second area (E2) are different.

The volume of the conductor and the ratio of the volume of the conductor in the first area (E1) can be adjusted by forming a conductor circuit (35FD) illustrated in FIG. 6B in the openings (35Fi, 35Si) illustrated in FIGS. 4A and 4B.

The volume of the conductor and the ratio of the volume of the conductor in the second area (E2) can be adjusted by forming the conductor circuit (35FD) illustrated in FIG. 6B in the openings (35Fe, 35Se) illustrated in FIGS. 4A and 4B.

The volume of the conductor and the ratio of the volume of the conductor in the first area (E1) can be adjusted by adjusting size and number of the conductor circuit (35FD).

The volume of the conductor and the ratio of the volume of the conductor in the second area (E2) can be adjusted by adjusting size and number of the conductor circuit (35FD).

FIFTH APPLIED EXAMPLE OF PRINTED WIRING BOARD

FIG. 6A illustrates a fifth applied example of the printed wiring board 10.

The fifth applied example includes the first applied example 110 illustrated in FIG. 3B and a circuit substrate 200 that is mounted on the first applied example 110. The first applied example 110 and the circuit substrate 200 are connected to each other via solder bumps (76FO) that are formed on an outer periphery of the printed wiring board.

An area of the first area, an area of the first surface (F) of the first area and an area of the second surface (S) of the first area are substantially equal. An area of the second area, an area of the first surface (F) of the second area and an area of the second surface (S) of the second area are substantially equal.

For example, when the area of the first area and the area of the second area are significantly different, it may be possible that the ratio of the volume of the conductor in the first area is greater than the ratio of the volume of the conductor in the second area, and the volume of the conductor in the first area is smaller than the volume of the conductor in the second area. In this case, priority is given to the ratios of the volumes of the conductors. Warpage in the printed wiring board or in the applied example is adjusted by adjusting the ratios of the volumes of the conductors.

A circuit substrate may have an insulating substrate, a first conductive pattern that is formed on one surface of the insulating substrate, and a second conductive pattern that is formed on the other surface of the insulating substrate. An electronic component may be mounted on the first conductive pattern. In order to reduce warpage of the insulating substrate, an area of the entire first conductive pattern and an area of the entire second conductive pattern may be set substantially the same. When the electronic component is mounted on such a circuit substrate, physical properties of the circuit substrate and physical properties of the electronic component are likely to be different. Examples of the physical properties include a thermal expansion coefficient and a Young's modulus. When an area that is positioned directly below the electronic component is referred to as a first area, and when the physical properties are different, the circuit substrate in the first area and the circuit substrate in a second area are likely to exhibit different behaviors during a heat cycle. Therefore, when the electronic component is mounted on the circuit substrate, complex deformation such as swelling is expected to occur. The circuit substrate may be divided into the first area and the second area.

In a printed wiring board according to an embodiment of the present invention, warpage and swelling are small. In a semiconductor device that is formed from a printed wiring board and a semiconductor element mounted on the printed wiring board according to an embodiment of the present invention, warpage and swelling is reduced. In a printed wiring board according to an embodiment of the present invention and a semiconductor device according to an embodiment of the present invention, deformation amounts are reduced.

A printed wiring board for mounting a semiconductor element according to an embodiment of the present invention includes: an insulating substrate that has a first surface and a second surface that is on an opposite side of the first surface; a conductor layer that is formed on the first surface; and a conductor layer that is formed on the second surface. The semiconductor element is mounted on the first surface. The printed wiring board is formed in a first area directly below the semiconductor element and in a second area outside the first area. The conductor layer that is formed on the first surface is formed by a conductor layer in the first area that is formed in the first area and a conductor layer in the second area that is formed in the second area. A value (ratio 1) that is obtained by dividing a volume of a conductor contained in the conductor layer in the first area by an area of the first area is greater than a value (ratio 2) obtained by dividing a volume of a conductor contained in the conductor layer in the second area by an area of the second area.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board for mounting a semiconductor element, comprising:
an insulating substrate;
a first conductor structure formed on a first side of the insulating substrate; and
a second conductor structure formed on a second side of the insulating substrate on an opposite side with respect to the first side,
wherein the insulating substrate has a first area and a second area outside the first area such that when a semiconductor element is mounted on the first side of the insulating substrate, the first area is directly below the semiconductor element, the first conductor structure has a first area conductor layer structure formed in the first area and a second area conductor layer structure formed in the second area, and the first conductor structure is formed such that the first and second area conductor layer structures include at least one solid pattern layer covering the first and second area and extending substantially an entire part of a surface on the first side of the insulating substrate and that a first ratio is set greater than a second ratio, where the first ratio is obtained by dividing a volume of the at least one solid pattern forming the first area conductor layer structure by the area of the first area, and the second ratio is obtained by dividing a volume of the at least one solid pattern forming the second area conductor layer structure by the area of the second area.

2. A printed wiring board according to claim 1, wherein the second conductor structure has a first area conductor layer structure formed in the first area and a second area conductor layer structure formed in the second area, and the second conductor structure is formed such that a third ratio is set greater than a fourth ratio, where the third ratio is obtained by dividing a volume of the first area conductor layer structure by the area of the first area in the second conductor structure, and the fourth ratio is obtained by dividing a volume of the second area conductor layer structure by the area of the second area in the second conductor structure.

3. A printed wiring board according to claim 1, wherein the second conductor structure has a first area conductor layer structure formed in the first area and a second area conductor layer structure formed in the second area, and the second conductor structure is formed such that a third ratio is set smaller than a fourth ratio, where the third ratio is obtained by dividing a volume of the first area conductor layer structure by the area of the first area in the second conductor structure, and the fourth ratio is obtained by dividing a volume of the second area conductor layer structure by the area of the second area in the second conductor structure.

4. A printed wiring board according to claim 1, wherein the second conductor structure comprises a plurality of second conductor layers formed on the second side of the insulating substrate, the first area conductor layer structure comprises a plurality of first area conductor layers formed in the first area, and the second area conductor layer structure comprises a plurality of second area conductor layers formed in the second area, and the plurality of first conductor layers is formed such that the first ratio is set greater than the second ratio, when the first ratio is obtained by dividing a volume of the first area conductor layers by the area of the first area, and the second ratio is obtained by dividing a volume of the second area conductor layers by the area of the second area.

5. A printed wiring board according to claim 1, wherein the at least one solid pattern forming the first area conductor layer structure has a plurality of openings formed in the first area such that the first ratio is adjusted by at least one of a size, a number and density of the openings in the first area, and the at least one solid pattern forming the second area conductor layer structure has a plurality of openings formed in the second area such that the second ratio is adjusted by at least one of a size, a number and density of the openings in the second area.

6. A printed wiring board according to claim 1, wherein the first conductor structure is formed such that a value obtained by dividing the first ratio by the second ratio is in a range of 1.2 to 5.

7. A semiconductor device, comprising:
a printed wiring board; and
a semiconductor element mounted on the printed wiring board,
wherein the printed wiring board comprises an insulating substrate, a first conductor structure formed on a first side of the insulating substrate, and a second conductor structure formed on a second side of the insulating substrate on an opposite side with respect to the first side, the insulating substrate has a first area and a second area outside the first area such that the semiconductor element is mounted on the first side of the insulating substrate and that the first area is directly below the semiconductor element, the first conductor structure has a first area conductor layer structure formed in the first area and a second area conductor layer structure formed in the second area, and the first conductor structure is formed such that the first and second area conductor layer structures include at least one solid pattern layer covering the first and second area and extending substantially an entire part of a surface on the first side of the insulating substrate and that a first ratio is set greater than a second ratio, where the first ratio is obtained by dividing a volume of the at least one solid pattern forming the first area conductor layer structure by the area of the first area, and the second ratio is obtained by dividing a volume of the at least one solid pattern forming the second area conductor layer structure by the area of the second area.

8. A semiconductor device according to claim 7, wherein the second conductor structure has a first area conductor layer structure formed in the first area and a second area conductor layer structure formed in the second area, and the second conductor structure is formed such that a third ratio is set greater than a fourth ratio, where the third ratio is obtained by dividing a volume of the first area conductor layer structure by the area of the first area in the second conductor structure, and the fourth ratio is obtained by dividing a volume of the second area conductor layer structure by the area of the second area in the second conductor structure.

9. A semiconductor device according to claim 7, wherein the second conductor structure has a first area conductor layer structure formed in the first area and a second area conductor layer structure formed in the second area, and the second conductor structure is formed such that a third ratio is set smaller than a fourth ratio, where the third ratio is obtained by dividing a volume of the first area conductor layer structure by the area of the first area in the second conductor structure, and the fourth ratio is obtained by dividing a volume of the second area conductor layer structure by the area of the second area in the second conductor structure.

10. A semiconductor device according to claim 7, wherein the first conductor structure comprises a plurality of first conductor layers formed on the first side of the insulating substrate, the second conductor structure comprises a plurality of second conductor layers formed on the second side of the insulating substrate, the first area conductor layer structure comprises a plurality of first area conductor layers formed in the first area, and the second area conductor layer structure comprises a plurality of second area conductor layers formed in the second area, and the plurality of first conductor layers is formed such that the first ratio is set greater than the second ratio, when the first ratio is obtained by dividing a volume of the first area conductor layers by the area of the first area, and the second ratio is obtained by dividing a volume of the second area conductor layers by the area of the second area.

11. A semiconductor device according to claim 7, wherein the at least one solid pattern forming the first area conductor layer structure has a plurality of openings formed in the first area such that the first ratio is adjusted by at least one of a size, a number and density of the openings in the first area, and the at least one solid pattern forming the second area conductor layer structure has a plurality of openings formed in the second area such that the second ratio is adjusted by at least one of a size, a number and density of the openings in the second area.

12. A semiconductor device according to claim 7, wherein the first conductor structure is formed such that a value obtained by dividing the first ratio by the second ratio is in a range of 1.2 to 5.

13. A method for manufacturing a printed wiring board, comprising:
preparing an insulating substrate having a first area and a second area outside the first area such that when a semiconductor element is mounted on a first side of the insulating substrate, the first area is directly below the semiconductor element;
forming a first conductor structure on the first side of an insulating substrate such that the first conductor structure has a first area conductor layer structure formed in the first area and a second area conductor layer structure formed in the second area, and that a first ratio is set greater than a second ratio; and
forming a second conductor structure on a second side of the insulating substrate on an opposite side with respect to the first side,
the forming of the first conductor structure comprises forming the first conductor structure such that the first and second area conductor layer structures include at least one solid pattern layer covering the first and second area and extending substantially an entire part of a surface on the first side of the insulating substrate and that the first ratio is obtained by dividing a volume of the at least one solid pattern forming the first area conductor layer structure by the area of the first area, and the second ratio is obtained by dividing a volume of the at least one solid pattern forming the second area conductor layer structure by the area of the second area.

14. A method for manufacturing a printed wiring board according to claim 13, wherein the forming of the second conductor structure comprises forming the second conductor structure such that the second conductor structure has a first area conductor layer structure formed in the first area and a second area conductor layer structure formed in the second area, and that a third ratio is set greater than a fourth ratio, where the third ratio is obtained by dividing a volume of the first area conductor layer structure by the area of the first area in the second conductor structure, and the fourth ratio is obtained by dividing a volume of the second area conductor layer structure by the area of the second area in the second conductor structure.

15. A method for manufacturing a printed wiring board according to claim 13, wherein the forming of the second conductor structure comprises forming the second conductor structure such that the second conductor structure has a first area conductor layer structure formed in the first area and a second area conductor layer structure formed in the second area, and that a third ratio is set smaller than a fourth ratio, where the third ratio is obtained by dividing a volume of the first area conductor layer structure by the area of the first area in the second conductor structure, and the fourth ratio is obtained by dividing a volume of the second area conductor layer structure by the area of the second area in the second conductor structure.

16. A method for manufacturing a printed wiring board according to claim 13, wherein the forming of the first conductor layers comprises adjusting an area of the first area conductor layer structure and an area of the second area conductor layer structure such that the first ratio is set greater than the second ratio.

17. A method for manufacturing a printed wiring board according to claim 13, wherein the forming of the first conductor structure comprises forming a plurality of first conductor layers on the first side of the insulating substrate such that the first area conductor layer structure comprises a plurality of first area conductor layers formed in the first area, that the second area conductor layer structure comprise a plurality of second area conductor layers formed in the second area, and that the first ratio is set greater than the second ratio, when the first ratio is obtained by dividing a volume of the first area conductor layers by the area of the first area, and the second ratio is obtained by dividing a volume of the second area conductor layers by the area of the second area, and the forming of the second conductor structure comprises forming a plurality of second conductor layers on the second side of the insulating substrate.

18. A method for manufacturing a printed wiring board according to claim 13, wherein the at least one solid pattern forming the first area conductor layer structure has a plurality of openings formed in the first area such that the first ratio is adjusted by at least one of a size, a number and density of the openings in the first area, and the at least one solid pattern forming the second area conductor layer structure has a plurality of openings formed in the second area such that the second ratio is adjusted by at least one of a size, a number and density of the openings in the second area.

19. A method for manufacturing a printed wiring board according to claim 13, wherein the forming of the first conductor structure comprises forming the first conductor structure such that a value obtained by dividing the first ratio by the second ratio is in a range of 1.2 to 5.

20. A method for manufacturing a printed wiring board according to claim 17, wherein the forming of the first conductor layers comprises adjusting an area of the at least one solid pattern forming the first area conductor layer structure and an area of the at least one solid pattern forming the second area conductor layer structure such that the first ratio is set greater than the second ratio.

\* \* \* \* \*